(12) United States Patent
Ishii

(10) Patent No.: US 7,193,331 B2
(45) Date of Patent: Mar. 20, 2007

(54) SEMICONDUCTOR DEVICE AND MANUFACTURING PROCESS THEREOF

(75) Inventor: Hideki Ishii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 63 days.

(21) Appl. No.: 11/132,292

(22) Filed: May 19, 2005

(65) Prior Publication Data

US 2005/0258531 A1 Nov. 24, 2005

(30) Foreign Application Priority Data

May 20, 2004 (JP) ............................. 2004-149912

(51) Int. Cl.
*H01L 23/29* (2006.01)
*H01L 23/28* (2006.01)

(52) U.S. Cl. ...................... 257/790; 257/787; 257/788; 257/793; 257/E31.117; 257/E23.116; 257/E21.502; 257/E21.504

(58) Field of Classification Search ...................... None
See application file for complete search history.

(56) References Cited

U.S. PATENT DOCUMENTS

| 5,780,925 | A | 7/1998 | Cipolla et al. | |
| 6,650,020 | B2 * | 11/2003 | Yamada et al. | 257/783 |
| 6,953,988 | B2 * | 10/2005 | Seo et al. | 257/666 |
| 7,091,623 | B2 * | 8/2006 | Tsai et al. | 257/783 |
| 2002/0020923 | A1 * | 2/2002 | Kanatake | 257/778 |
| 2002/0079590 | A1 * | 6/2002 | Nataoka et al. | 257/777 |

FOREIGN PATENT DOCUMENTS

JP  11-288977  10/1999

* cited by examiner

*Primary Examiner*—Jasmine Clark
(74) *Attorney, Agent, or Firm*—Oblon, Spivak, McClelland, Maier & Neustadt, P.C.

(57) ABSTRACT

One of the aspects of the present invention is to provide a semiconductor device, which includes a circuit board, a first semiconductor chip mounted on the circuit board, a built-in semiconductor package on the first semiconductor chip, and a first molded resin encompassing the first semiconductor chip and the built-in semiconductor package. The built-in semiconductor package includes at least one second semiconductor chip mounted on a die pad, and the second semiconductor chip has a plurality of terminals. Also, the built-in semiconductor package includes a plurality of lead frames, and each of the lead frames is electrically connected with respective one of the terminals of the second semiconductor chip, and has a connection region on one side and a support region on the other opposing side. Further, the built-in semiconductor package a second molded resin encompassing the die pad, the second semiconductor chip, and the lead frames so that each of the connection regions is exposed and each of the support regions is covered. While the second molded resin has top and bottom surfaces, a plane flush with the connection region locates between the top and bottom surfaces of the second molded resin.

9 Claims, 5 Drawing Sheets

Fig. 1
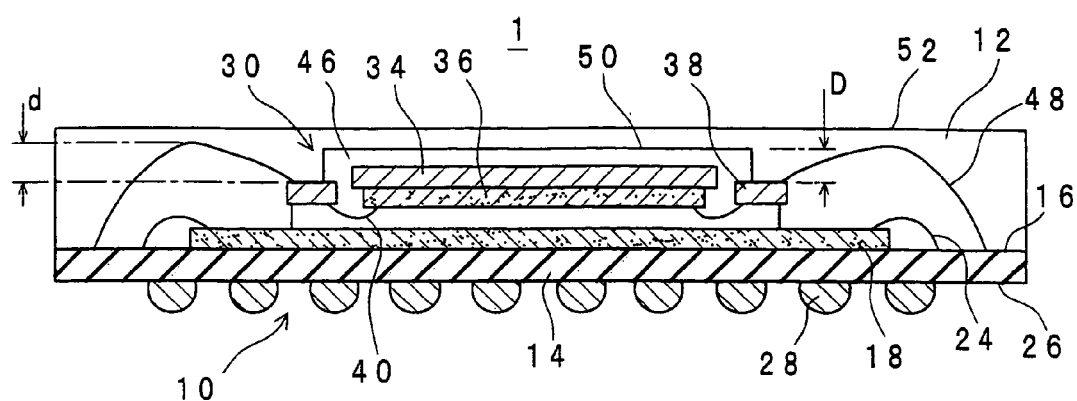
Fig. 2A
Fig. 2B
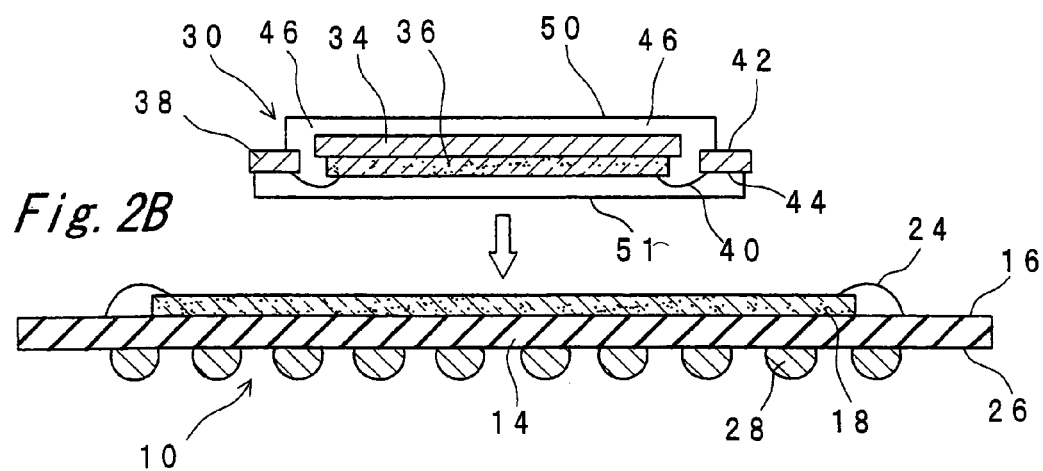

SEMICONDUCTOR DEVICE AND MANUFACTURING PROCESS THEREOF

BACKGROUND OF THE INVENTION

1) Technical Field of the Invention

The present invention relates to a semiconductor device and a manufacturing process thereof, and in particular, relates to so-called a multi-chip-package semiconductor device integrating a plurality of chips within one package and the manufacturing process thereof.

2) Description of Related Arts

Recent innovation of many electrical apparatuses in downsizing and multi-functioning also demands downsizing and multi-functioning of semiconductor devices incorporated in the electrical apparatus. To satisfy this demand, various semiconductor devices have been proposed, including a semiconductor device having a single semiconductor IC chip integrating a memory circuitry and a logic circuitry. Alternatively, a technique well known as a System in Package (SiP) has been developed, in which a memory IC chip and a logic IC chip are integrated within a single package.

The semiconductor IC chip having a plurality of circuitries serving different functions requires, when compared with a mono-functioning IC chip, a more prolonged design period and a more extended production line for various steps of the manufacturing process, thereby causing the production yield to be reduced. Also, the multi-functioning semiconductor IC chip has, in general, a chip surface that becomes wider than the mono-functioning chip.

Meanwhile, the above-referenced conventional SiP technology proposes, for example, the semiconductor device including a plurality of semiconductor chips arranged in parallel on a printed circuit board. However, those semiconductor chips which are arranged in parallel on the board and molded with resin also prevents the package size of the semiconductor device, i.e., the mounting area of the semiconductor device to the board from being reduced.

In addition, many other semiconductor devices are well known, which has one semiconductor chip mounted on another semiconductor chip by means of the SiP technology. For example, the Japanese Patent Application No. 11-288977 illustrates, in FIG. 1, a stacked chip 11 including a semiconductor chip 3 with a memory circuitry 8 stacked on a semiconductor chip 1 with a logic circuitry 3. Also, FIG. 3 shows that the stacked chip 11 is mounted on a board 12 and an insulating resin is molded fully covering the stacked chip 11. Further, in FIG. 5, the stacked chip 11 is mounted on a plurality of inner leads 18 and also the insulating resin is molded that wholly encompasses the stacked chip 11.

However, in case where one (upper) semiconductor chip is mounted on another (lower) semiconductor chip, the chip size of the upper semiconductor chip has to be smaller than the bonding pad region of the lower semiconductor chip, thus, the upper semiconductor chip has a constraint in the chip size. Also, as the number of semiconductor chips molded in the semiconductor device increases, the semiconductor device may totally be condemned at a final inspection step even if only one of the semiconductor chips fails. This reduces the production yield of the semiconductor device thereby to raise the manufacturing cost thereof.

SUMMARY OF THE INVENTION

To address the aforementioned drawbacks, one of the aspects of the present invention is to provide a semiconductor device including a plurality of semiconductor chips with different functions and reducing the package size and thickness in a direction vertical to the mounting surface, and a manufacturing process thereof.

In particular, one of the aspects of the present invention is to provide a semiconductor device, which includes a board, a first semiconductor chip mounted on the board, a built-in semiconductor package on the first semiconductor chip, and a first molded resin encompassing the first semiconductor chip and the built-in semiconductor package. The built-in semiconductor package includes at least one second semiconductor chip mounted on a die pad, and the second semiconductor chip has a plurality of terminals. Also, the built-in semiconductor package includes a plurality of lead frames, and each of the lead frames is electrically connected with respective one of the terminals of the second semiconductor chip, and has a connection region on one side and a support region on the other opposing side. Further, the built-in semiconductor package a second molded resin encompassing the die pad, the second semiconductor chip, and the lead frames so that each of the connection regions is exposed and each of the support regions is covered. While the second molded resin has top and bottom surfaces, a plane flush with the connection region locates between the top and bottom surfaces of the second molded resin.

Further scope of applicability of the present invention will become apparent from the detailed description given herein. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention more fully be understood from the detailed description given herein and accompanying drawings which are given by way of illustration only, and thus are not limitative of the present invention.

FIG. 1 is a cross sectional view of a semiconductor device according to the first embodiment of the present invention.

FIGS. 2A and 2B are exploded cross sectional views of the semiconductor device of FIG. 1.

DETAILED DESCRIPTION OF THE PREFERRED EMBODIMENTS

Figure 3:
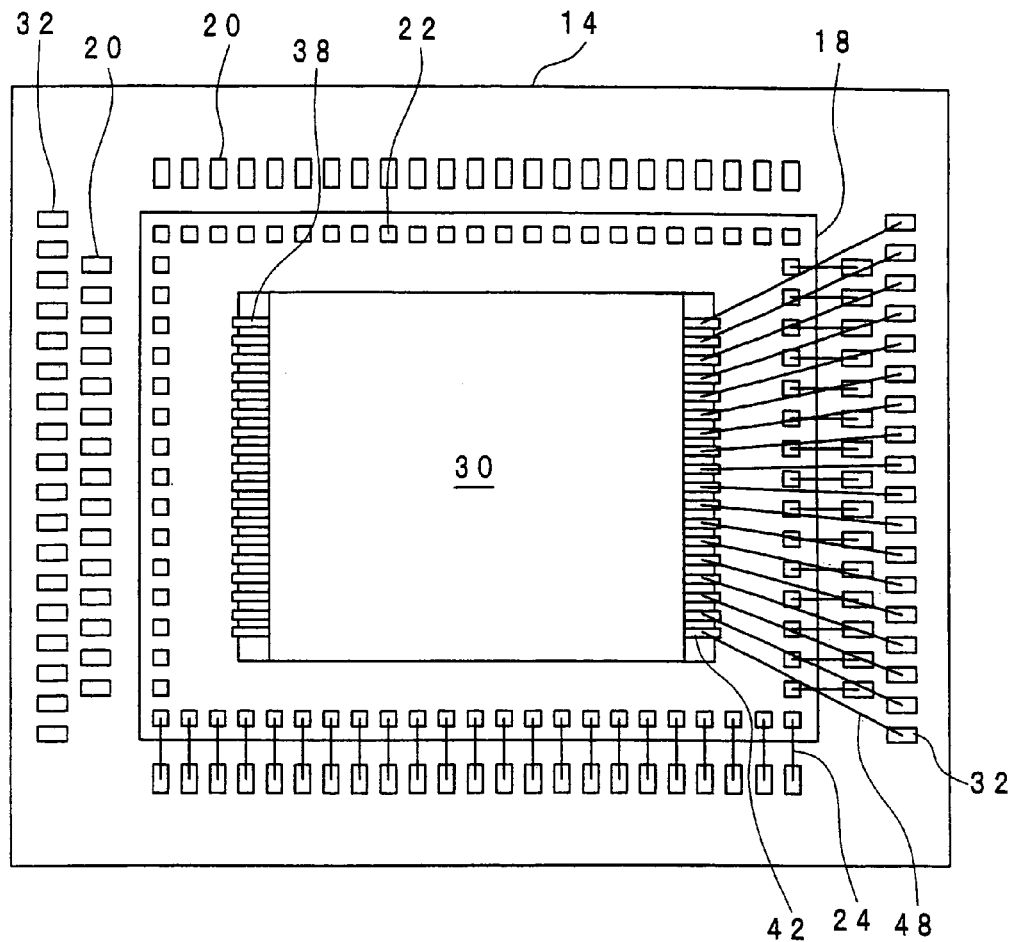
FIG. 3 is a top plan view of the semiconductor device of FIGS. 2A and 2B.

Referring to the attached drawings, the details of embodiments according to the present invention will be described herein. In those descriptions, although the terminology indicating the directions (for example, "upper" and "lower") is conveniently used just for clarity, it should not be interpreted that those terminology limit the scope of the present invention.

Embodiment 1.

With reference to FIGS. 1 to 6, a semiconductor device according to the first embodiment of the present invention will be described herein. As illustrated in FIGS. 1, 2A and 2B, the semiconductor device includes, in general, a board type semiconductor package 10, a built-in type semiconductor package 30 mounted thereon (which are referred herein to simply as a "board semiconductor package" and a "built-in semiconductor package"), and a first molded resin 12 encompassing those semiconductor packages 10, 30. For clarity, the hatching of the first molded resin 12 is eliminated in FIG. 1, and the first molded resin 12 is not shown in FIG. 2.

As shown in FIGS. 1 and 2B, the board semiconductor package 10 includes a printed circuit board 14 and a first semiconductor chip 18 (e.g., a logic IC chip) mounted on an upper surface 16 of the printed circuit board 14 via any conductive adhesive such as solder (not shown).

As illustrated in FIG. 3, the printed circuit board 14 has a rectangular planar shape having two pairs of opposing members (four members) and a plurality of bonding pads 20 for the first semiconductor chip 18, which are arranged on the upper surface 16 and along the four members. It also includes a plurality of bonding pads 32 for the built-in semiconductor package 30, which are arranged along one pair of the opposing members. Further, the logic IC chip 18 includes a plurality of terminals (bonding pads) 22 that are electrically connected with bonding pads 20 of the printed circuit board 14 via a plurality of conductive wires 24 such as gold wires. (For clarity, illustration of the conductive wires 24 is partially eliminated in FIG. 3.)

Also, the printed circuit board 14 generally includes a plurality of lands (not shown) arranged on the lower surface 26 in a grid array and a plurality of conductive bumps such as solder bumps (see FIGS. 1 and 2B). However, if the thickness of the semiconductor device 1 is desired to be minimized, the solder bumps may be eliminated.

Meanwhile, the built-in semiconductor package 30 includes, as shown in FIGS. 1 and 2A, a die pad 34, at least one second semiconductor chip 36 (e.g., a memory IC chip) mounted on the lower surface of the die pad 34 via a conductive adhesive such as solder (not shown), and a plurality of lead frames 38. The memory IC chip 36 has a plurality of terminals (not shown), each of which is electrically connected with respective one of the lead frames 38 via the gold wire 40.

Each of the lead frames 38 has a connection region 42 on an upper side and a support region 44 on the other opposing side (lower side), as illustrated in FIG. 2A. Also, the built-in semiconductor package 30 includes a second molded resin 46 encompassing the whole of the die pad 34, the memory IC chip 36, and the lead frames 38 except the connection regions 42. (Again, for clarity of figures, the hatching of the second molded resin 46 is eliminated.) Thus, the second molded resin 46 is formed such that each of the connection regions is exposed and each of the support regions is covered and supported by the second molded resin 46.

Further, after the built-in semiconductor package 30 is mounted on the first semiconductor chip 18 as shown in FIG. 3, each of the connection regions 42 of the lead frames 38 are electrically connected with corresponding one of the bonding pads 32 of the printed circuit board 14 via conductive wires 48. (For clarity, illustration of the conductive wires 48 is partially eliminated in FIG. 3.)

Figure 4:
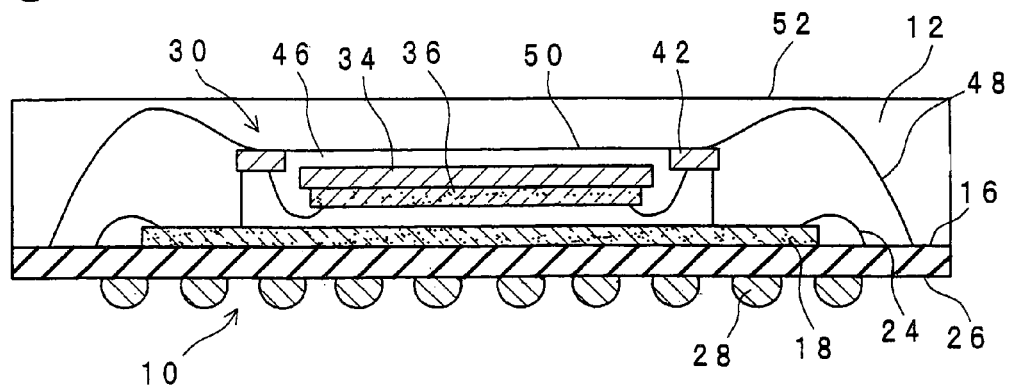
FIG. 4 is a cross sectional view of another semiconductor device contrastive to one of FIG. 1.

By the way, when viewed in the cross sectional direction, as shown in FIG. 1, the gold wire 48 for connection between the connection regions 42 of the lead frames 38 and the bonding pads 32 of the printed circuit board 14 draws, in general, a curve with an upwardly convex peak. Thus, the gold wire 48 goes up by a rising distance d from the connection region 42 in the thickness (vertical) direction and approaches down to the bonding pad 32. Therefore, suppose if the connection regions 42 of the lead frames 38 is located in a plane flush with a top surface (package surface) 50 of the built-in semiconductor package 30 as illustrated in FIG. 4, then the first molded resin 12 must have the thickness greater than the rising distance d to allow the gold wire to be covered with the first molded resin 12. In other words, the thickness between the connection region 42 and a top surface (package surface) 52 of the first molded resin 12 should be set more than the rising distance d.

However, as clearly shown in FIG. 1, since the built-in semiconductor package 30 according to the present invention has the connection region 42 located below the top surface 50 of the second molded resin 46 by the distance D which can cancel or absorb the rising distance d of the gold wire 48. In other words, a plane flush with the connection region 42 locates between the top surface 50 and the bottom surface 51 of the built-in semiconductor package 30 (see FIG. 2A) for substantially reducing the thickness of the first molded resin 12 and as well as the thickness of the semiconductor device 1.

More preferably, the connection region 42 is designed such that the distance D between the connection region 42 and the top surface 50 is greater than the rising distance d of the gold wire 48. This prevents the thickness of the semiconductor device 1 from increasing due to the gold wire 48 having the upwardly convex peak.

As described above, since a plurality of semiconductor chips 18, 36 with different functions are integrated within one package, the functionality of the semiconductor device 1 according to the present invention can substantially be enhanced.

In the above description, the electrical connection between the first semiconductor chip 18 and the printed circuit board 14 is described as being made by means of a plurality of conductive wires, i.e., in a wire-bonding process, it may equally be made by a plurality of conductive bumps, i.e., in a flip-chip bonding process. Thus, the first semiconductor chip 18 may be electrically connected with the printed circuit board 14 via a plurality of conductive bumps (not shown). Therefore, any package size of the built-in semiconductor package 30 can be stacked on the first semiconductor chip 18 because no gold wire 24 is bonded. This eliminates the constraint for the chip size of the upper (second) semiconductor chip 36, which is one of the drawbacks of the semiconductor device of the conventional SiP technology, thereby facilitating the design of the multi-chip-package semiconductor device.

Furthermore, according to the present embodiment, since a plurality of semiconductor chips 18 and 36 are stacked in the vertical direction, the package size of the semiconductor device 1 can be reduced in the traverse direction. Also, since a plane flush with the connection region 42 locates between the top and bottom surfaces 50, 51 of the built-in semiconductor package 30, the thickness in the vertical direction of the semiconductor device 1 can be further reduced.

In addition, as will be described herein in more detail, since the support region 44 of the lead frame 38 opposing to the connection region 42 is supported by the second molded resin 46, the wire bonding on the connection region 42 can be facilitated.

Figure 5:
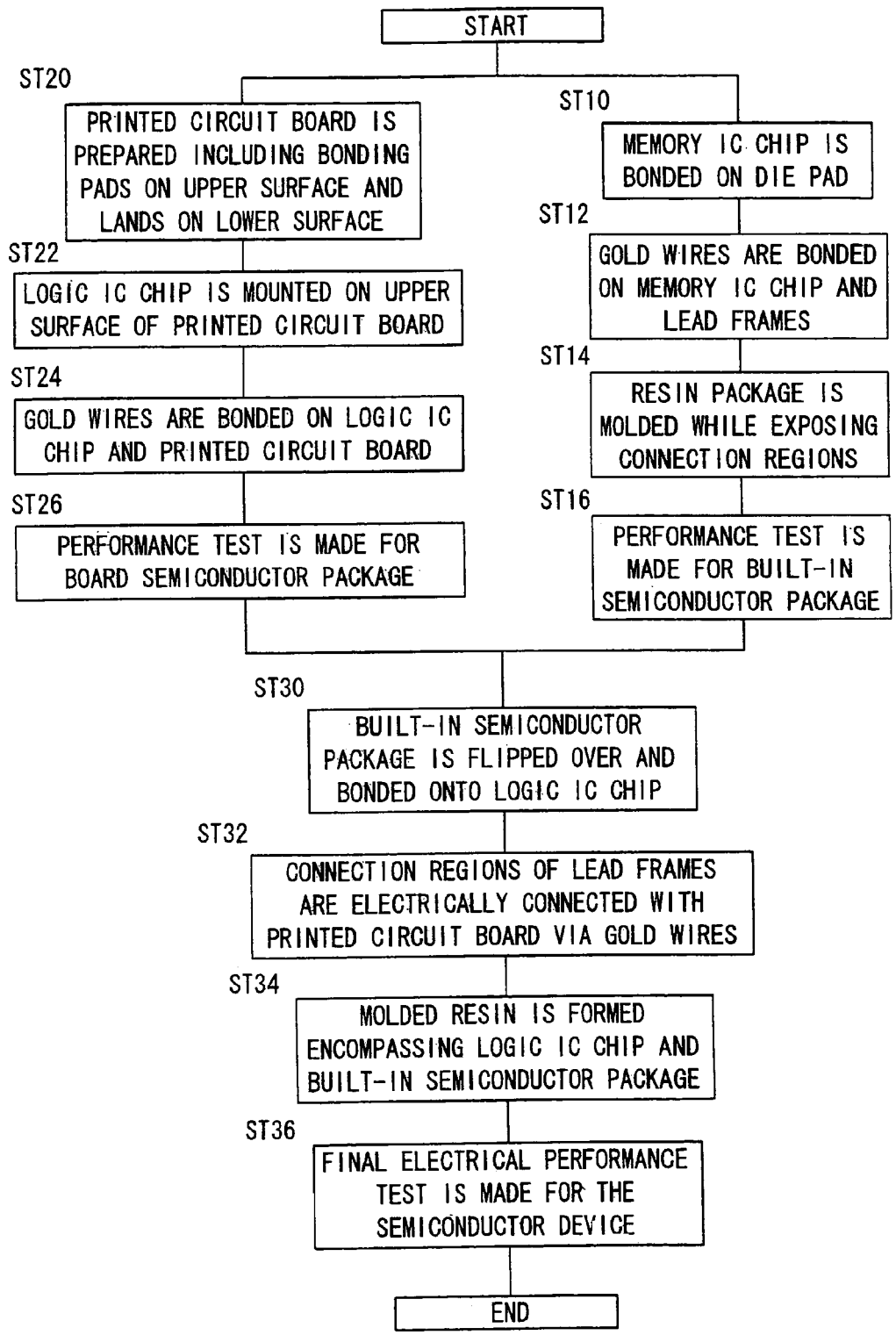
FIG. 5 is a flow chart illustrating a manufacturing process of the semiconductor device of FIG. 1.
Figure 6:
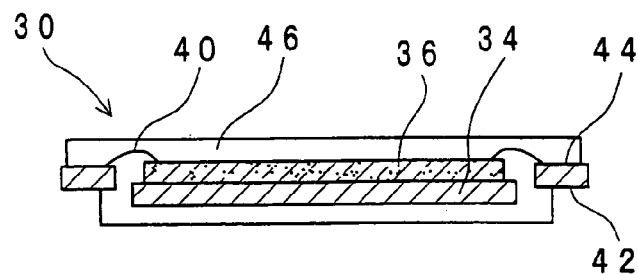
FIG. 6 is a cross sectional view of the built-in semiconductor package of FIG. 1.

Next, referring to FIGS. 5 and 6, a manufacturing process of the semiconductor device 1 according to the present invention will be described herein.

Firstly, the steps for manufacturing the built-in semiconductor package 30 will be described. In the step ST10 of the flow chart indicated in FIG. 5, the second semiconductor chip (e.g., memory IC chip) 36 is bonded on the die pad as illustrated in FIG. 6. It should be noted that the built-in semiconductor package 30 of FIG. 6 is flipped over when comparing with one of FIGS. 1 and 2A.

In the step ST12, a plurality of gold wires 40 are bonded both on the terminals of the memory IC chip 36 and on respective one of the lead frames 38 in the wire bonding process.

In the step ST14, a resin package is molded to encompass the die pad 34, the memory IC chip 36, and the lead frames 38, so that each of the connection regions 42 is exposed and each of the support regions 44 is covered.

In the step ST16, the electrical performance test of the built-in semiconductor package 30 so produced is made for securing rejection of inferior products.

Secondary, the steps for manufacturing the board semiconductor package 10 will be described. In the step ST20, the printed circuit board 14 is prepared, which includes a plurality of bonding pads 20, 32 on the upper surface 16 for the first semiconductor chip 18 and the built-in semiconductor package 30, respectively, and also includes a plurality of lands on the lower surface 26 for connection to the external device (not shown). If necessary, a plurality of solder bumps 28 are provided on the lands.

In the step ST22, the first semiconductor chip (e.g., logic IC chip) 18 is mounted on the upper surface 16 of the printed circuit board 14.

Next, in the steps ST24, the gold wires 24 are bonded both onto the terminals 22 of the logic IC chip 18 and the bonding pads 20 of the printed circuit board 14. As described above, the electrical connection between the logic IC chip 18 and the printed circuit board 14 may be achieved by means of the flip-chip bonding process.

Then, in the step ST26, the electrical performance test of the board semiconductor package 10 so assembled is conducted for rejecting any inferior products.

In the step ST30, the built-in semiconductor package 30 accepted at the performance test is flipped over (to direct the connection regions 42 upwardly) as shown in FIG. 2A, and is mounted on the first semiconductor chip 18 as shown in FIG. 2B.

In the step ST32, each of the connection regions 42 of the lead frames 38 is electrically connected with respective one of the bonding pads 32 of the printed circuit board 14 via gold wires 48. According to the present embodiment, since the support regions 44 of the lead frames 38 opposing to the connection regions 42 are securely supported by the second molded resin 46, the gold wires 48 are readily bonded onto the connection regions 42. In other words, unless the support regions 44 are supported, the lead frames 38 will not be able to endure the force applied during the wire-bonding and bend downwardly, thereby preventing the gold wires 48 from being bonded in a reliable manner.

In the step ST34, the first molded resin 12 is formed encompassing the first semiconductor chip 18 and the built-in semiconductor package 30 to finalize the semiconductor device 1.

Lastly, in the step ST36, the final electrical performance test is made for the semiconductor device 1.

As above, according to the manufacturing process of the semiconductor device 1 of the present invention, the board semiconductor package 10 and the built-in semiconductor package 30 are individually inspected, and then the only accepted packages 10, 30 are assembled together. Therefore, the production yield of the semiconductor device 1 at the step ST36 can remarkably be improved thereby to substantially reduce the manufacturing cost thereof.

Embodiment 2.

Figure 7:
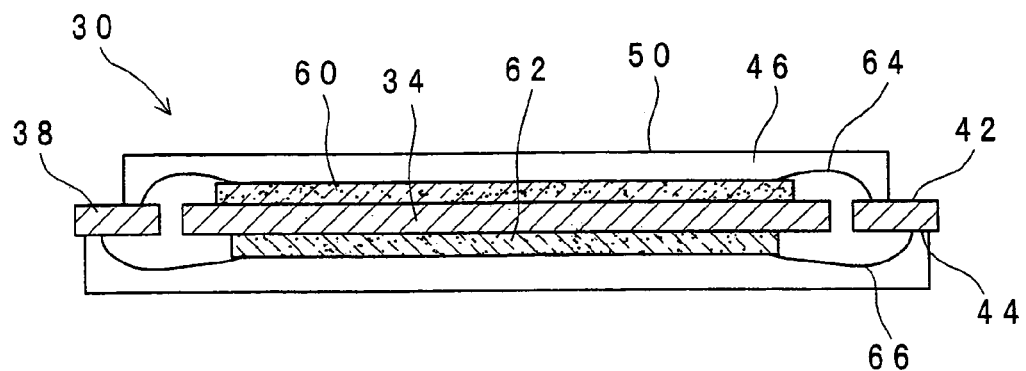
FIG. 7 is a cross sectional view of another built-in semiconductor package according to the second embodiment of the present invention.

Referring to FIG. 7, another semiconductor device according to the second embodiment of the present invention will be described herein. The semiconductor device 1 of the second embodiment is similar to that of the first embodiment except that at least one semiconductor chip is mounted on the upper and lower surfaces of the die pad of the built-in semiconductor package, respectively. The components shown in FIG. 7 similar to those in FIG. 2A have the reference numerals similar thereto, and the duplicate description for the similar structure of the second embodiment will be eliminated.

As illustrated in FIG. 7 corresponding to FIG. 2A of the first embodiment, the built-in semiconductor package 30 of the second embodiment includes at least two semiconductor chips (e.g., a flush memory and a static random access memory) 60, 62, each of which is mounted on the upper and lower surfaces of the die pad 34, respectively. The flush memory 60 and the static random access memory 62 have a plurality of terminals (not shown), each of which are electrically connected with the lead frames 38 via the gold wires 64, 66, respectively.

As can be seen in those drawings, since the built-in semiconductor package 30 of the second embodiment includes more semiconductor chips 60, 62 in number than that of the first embodiment, the functionality of the semiconductor device 1 can be further enhanced.

Also, in the built-in semiconductor package 30 of the second embodiment, as the first embodiment, the resin package (the second molded resin 46) is molded such that each of the connection regions 42 is exposed and each of the support regions 44 is covered. Therefore, the gold wires 48 can readily be bonded onto the connection regions 42 of the lead frames 38 in a reliable manner.

Furthermore, since the connection regions 42 are located below the top package surface 50 of the built-in semiconductor package 30, the total thickness of the semiconductor device 1 can be reduced.

Embodiment 3.

Figure 8:
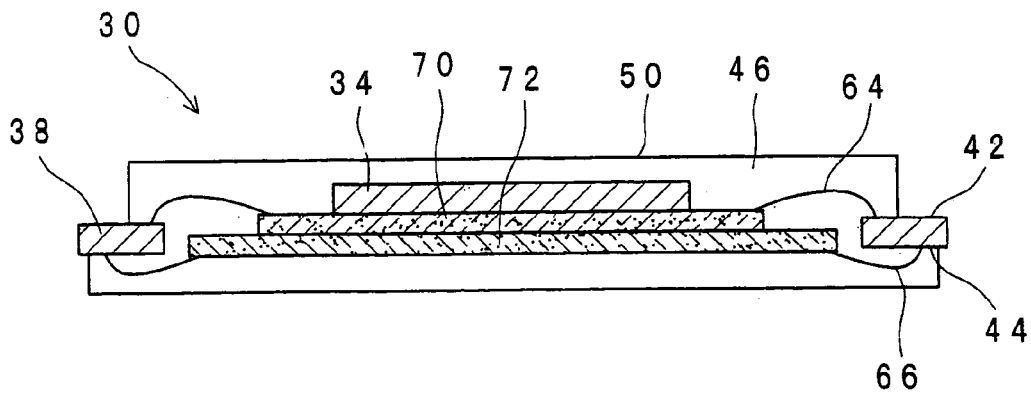
FIG. 8 is a cross sectional view of another built-in semiconductor package according to the third embodiment of the present invention.

Referring to FIG. 8, another semiconductor device according to the third embodiment of the present invention will be described herein. The semiconductor device 1 of the third embodiment is similar to that of the first embodiment except that another third semiconductor chip is mounted on the second semiconductor chip on the die pad. The components shown in FIG. 8 similar to those in FIG. 2A have the reference numerals similar thereto, and the duplicate description for the similar structure of the third embodiment will be eliminated.

As above, in FIG. 8 corresponding to FIG. 2A of the first embodiment, the built-in semiconductor package 30 of the third embodiment includes a second semiconductor chip (e.g., a flush memory) 70 on the lower surface of the die pad 34, on which a third semiconductor chip (e.g., the static random access memory) 72 is further mounted. The static random access memory 72 has a surface area greater than that of the flush memory 70. The flush memory 70 and the static random access memory 72 each have a plurality of terminals (not shown), which are electrically connected with the lead frames 38 via the gold wires 64, 66, respectively.

The built-in semiconductor package 30 so structured of the third embodiment includes more semiconductor chips 70, 72 in number than that of the first embodiment, the functionality of the semiconductor device 1 can be further enhanced.

Also, the built-in semiconductor package 30 of the third embodiment is molded with resin such that each of the connection regions 42 is exposed and each of the support regions 44 is covered. Therefore, the wire bonding process can readily and reliably be achieved for electrical connection between the connection regions 42 of the lead frames 38 and the bonding pads 32 of the printed circuit board 32.

In addition, as the connection regions 42 are located between the top and bottom surfaces 50, 51 of the built-in semiconductor package 30, the total thickness of the semiconductor device 1 can be reduced.

Embodiment 4.

Figure 9:
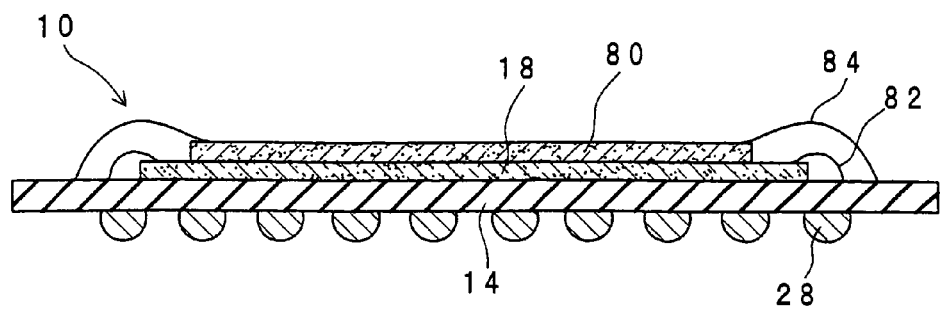
FIG. 9 is a cross sectional view of a board semiconductor package according to the fourth embodiment of the present invention.

Referring to FIG. 9, another semiconductor device according to the fourth embodiment of the present invention will be described herein. The semiconductor device 1 of the fourth embodiment is similar to that of the first embodiment except that the board semiconductor package has another fourth semiconductor chip is mounted on the third semiconductor chip on the printed circuit board. The components shown in FIG. 9 similar to those in FIG. 2B have the reference numerals similar thereto, and the duplicate description for the similar structure of the fourth embodiment will be eliminated.

As above, in FIG. 9 corresponding to FIG. 2B of the first embodiment, the board semiconductor package 10 of the fourth embodiment includes a fourth semiconductor chip (e.g., a logic IC chip) 80 directly mounted on the first semiconductor chip 18. The semiconductor chips 18, 80 each have a plurality of terminals, which are electrically connected with respective one of the bonding pads 20 of the printed circuit board 14 via gold wires 82, 84, respectively.

The semiconductor device 1 according to the fourth embodiment can be produced by mounting any one of the built-in semiconductor package 30 described above onto the fourth semiconductor chip 80, and by molding the whole of the board semiconductor package 10 and the built-in semiconductor package 30 with the first molded resin 12.

The board semiconductor package 10 so structured of the fourth embodiment includes various semiconductor chips 18, 80 than that of the first embodiment, the functionality of the semiconductor device 1 can be further enhanced.

Embodiment 5.

Figure 10:
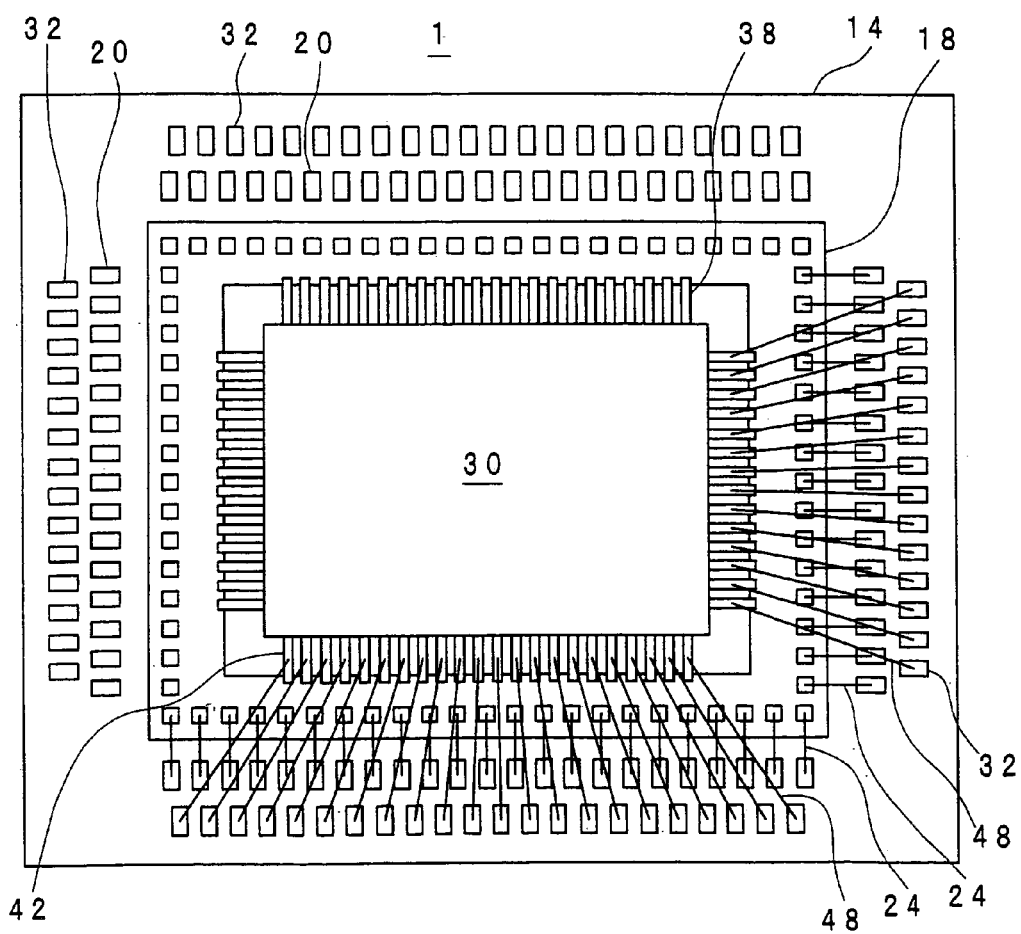
FIG. 10 is a top plan view of another semiconductor device according to the fifth embodiment of the present invention.

Referring to FIG. 10, another semiconductor device according to the fifth embodiment of the present invention will be described herein. The semiconductor device 1 of the fifth embodiment is similar to that of the first embodiment except that the built-in semiconductor package has a plurality of lead frames extending from each one of four members thereof and that the board semiconductor package has a plurality of bonding pads arranged along each of the members on the upper surface thereof.

As illustrated in FIG. 10 corresponding to FIG. 3 of the first embodiment, the printed circuit board 14 of the fifth embodiment has a rectangular planar configuration with four members and includes a plurality of bonding pads 20, 32 for the first semiconductor chip 18 and the built-in semiconductor package 30, respectively. Those bonding pads 20, 32 are arranged on the upper surface 16 and along each of the members of the printed circuit board 14. Also, the built-in semiconductor package 30 of the fifth embodiment also has a rectangular planar shape with four members and includes a plurality of lead frames 38 extending from each of the members. Each of the lead frames 38 is electrically connected with respective one of the bonding pads 32.

Thus, extension of the lead frames 38 from each one of four members of the built-in semiconductor package 30 allows more lead frames in number to connect with the bonding pads 20, 32 of the printed circuit board 14. Therefore, according to semiconductor device 1 of the fifth embodiment, the number of the electrical connection paths can readily be increased without expanding the area of the semiconductor device 1.

What is claimed is:

1. A semiconductor device, comprising:
   a circuit board;
   a first semiconductor chip mounted on said circuit board;
   a built-in semiconductor package on said first semiconductor chip; and
   a first molded resin encompassing said first semiconductor chip and said built-in semiconductor package;
   said built-in semiconductor package including,
      at least one second semiconductor chip mounted on a die pad, said second semiconductor chip having a plurality of terminals,
      a plurality of lead frames, each of said lead frames being electrically connected with respective one of the terminals of said second semiconductor chip and having a connection region on one side and a support region on the other opposing side, and
      a second molded resin encompassing said die pad, said second semiconductor chip, and said lead frames so that each of the connection regions is exposed and each of the support regions is covered, said second molded resin having top and bottom surfaces,
   wherein a plane flush with the connection region is located between the top and bottom surfaces of said second molded resin.

2. The semiconductor device according to claim 1, wherein each of said lead frames is electrically connected with respective one of the terminals of said second semiconductor chip via a conductive wire.

3. The semiconductor device according to claim 1, wherein said first semiconductor chip is electrically connected with said circuit board via at least one conductive wire.

4. The semiconductor device according to claim 1, wherein said first semiconductor chip is electrically connected with said circuit board via at least one conductive bump between said first semiconductor chip and said circuit board.

5. The semiconductor device according to claim 1, wherein the die pad of said built-in semiconductor package includes upper and lower surfaces, and said second semiconductor chip being mounted on at least either one of the upper and lower surfaces of the die pad.

6. The semiconductor device according to claim 1, wherein said built-in semiconductor package includes at least one third semiconductor chip mounted on said second semiconductor chip.

7. The semiconductor device according to claim 1, wherein said built-in semiconductor package includes a planar shape having two pairs of opposing members, and said lead frames extending from at least either one of pair of the opposing members.

8. A manufacturing process of a semiconductor device, comprising:

mounting a first semiconductor chip on a circuit board;

mounting at least one second semiconductor chip on a die pad, said second semiconductor chip having a plurality of terminals;

electrically connecting each one of a plurality of lead frames with respective one of the terminals of said second semiconductor chip, each of said lead frames having a connection region on one side and a support region on the other opposing side; and molding a resin to form a built-in semiconductor package having top and bottom surfaces, said built-in semiconductor package encompassing said die pad, said second semiconductor chip, and said lead frames, so that each of the connection regions is exposed, each of the support regions is covered, and a plane flush with the connection region located between the top and bottom surfaces of said built-in semiconductor package;

mounting said built-in semiconductor package on said first semiconductor chip;

electrically connecting each of the connection regions of said lead frames with said circuit board;

molding a resin encompassing said first semiconductor chip and said resin package.

9. A built-in semiconductor package to be built in a semiconductor device, the built-in semiconductor package comprising:

at least one semiconductor chip mounted on a die pad, said semiconductor chip having a plurality of terminals;

a plurality of lead frames, each of said lead frames being electrically connected with respective one of the terminals of said semiconductor chip and having a connection region on one side and a support region on the other opposing side, and a molded resin encompassing said die pad, said semiconductor chip, and said lead frames so that each of the connection regions is exposed and each of the support regions is covered, said molded resin having top and bottom surfaces;

wherein a plane flush with the connection region is located between the top and bottom surfaces of said molded resin.

* * * * *